United States Patent
Willer et al.

(10) Patent No.: US 7,868,415 B2
(45) Date of Patent: Jan. 11, 2011

(54) INTEGRATED CIRCUIT WITH AN ACTIVE AREA LINE HAVING AT LEAST ONE FORM-SUPPORTING ELEMENT AND CORRESPONDING METHOD OF MAKING AN INTEGRATED CIRCUIT

(75) Inventors: Josef Willer, Riemerling (DE); Michael Specht, München (DE); Christoph Friederich, München (DE); Doris Keitel-Schulz, Hoehenkirchen (DE)

(73) Assignee: Qimonda AG, Munich (DE)

( * ) Notice: Subject to any disclaimer, the term of this patent is extended or adjusted under 35 U.S.C. 154(b) by 99 days.

(21) Appl. No.: 12/177,930

(22) Filed: Jul. 23, 2008

(65) Prior Publication Data

US 2010/0019345 A1    Jan. 28, 2010

(51) Int. Cl.
*H01L 23/58*    (2006.01)

(52) U.S. Cl. .................. 257/522; 257/201; 257/202; 257/712; 257/E23.002; 257/E21.218; 257/206

(58) Field of Classification Search .................. 257/522, 257/712, E23.002, E21.218, 202, 206, 201
See application file for complete search history.

(56) References Cited

U.S. PATENT DOCUMENTS

2005/0255387 A1* 11/2005 Butt et al. .................... 430/5
2006/0245233 A1* 11/2006 Mikolajick et al. .......... 365/100

* cited by examiner

*Primary Examiner*—Wael M Fahmy
*Assistant Examiner*—Marc Armand
(74) *Attorney, Agent, or Firm*—John S. Economou

(57) ABSTRACT

An integrated circuit is described. The integrated circuit may have: an active area line formed of a material of a semiconductor substrate with a first longitudinal direction parallel to an upper surface of the semiconductor substrate; wherein the active area line has at least one form-supporting element extending in a second longitudinal direction parallel to the upper surface of the semiconductor substrate; and wherein the second longitudinal direction is arranged with regard to the first longitudinal direction in an angle unequal to 0 degree and unequal to 180 degree.

12 Claims, 16 Drawing Sheets

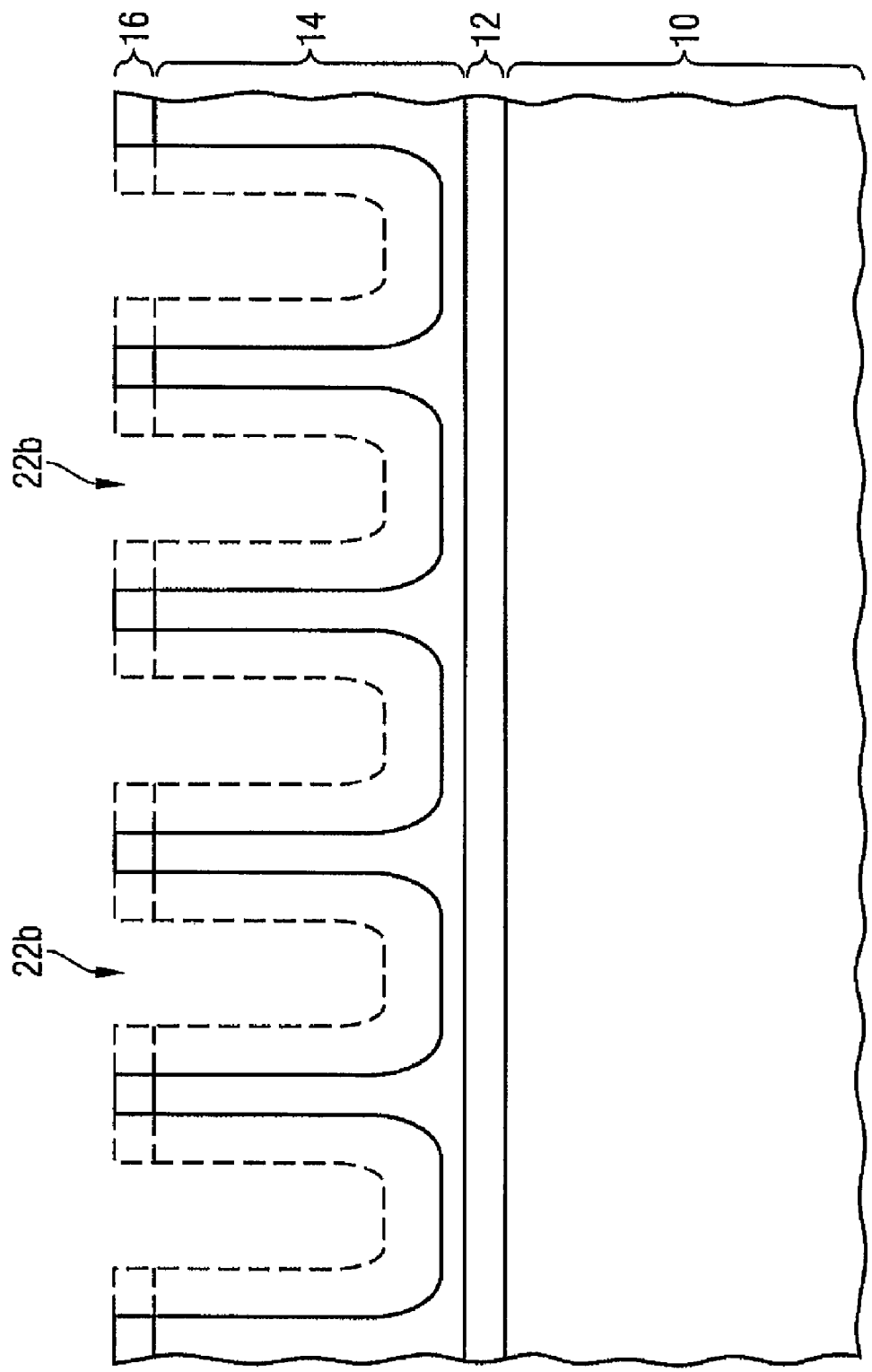

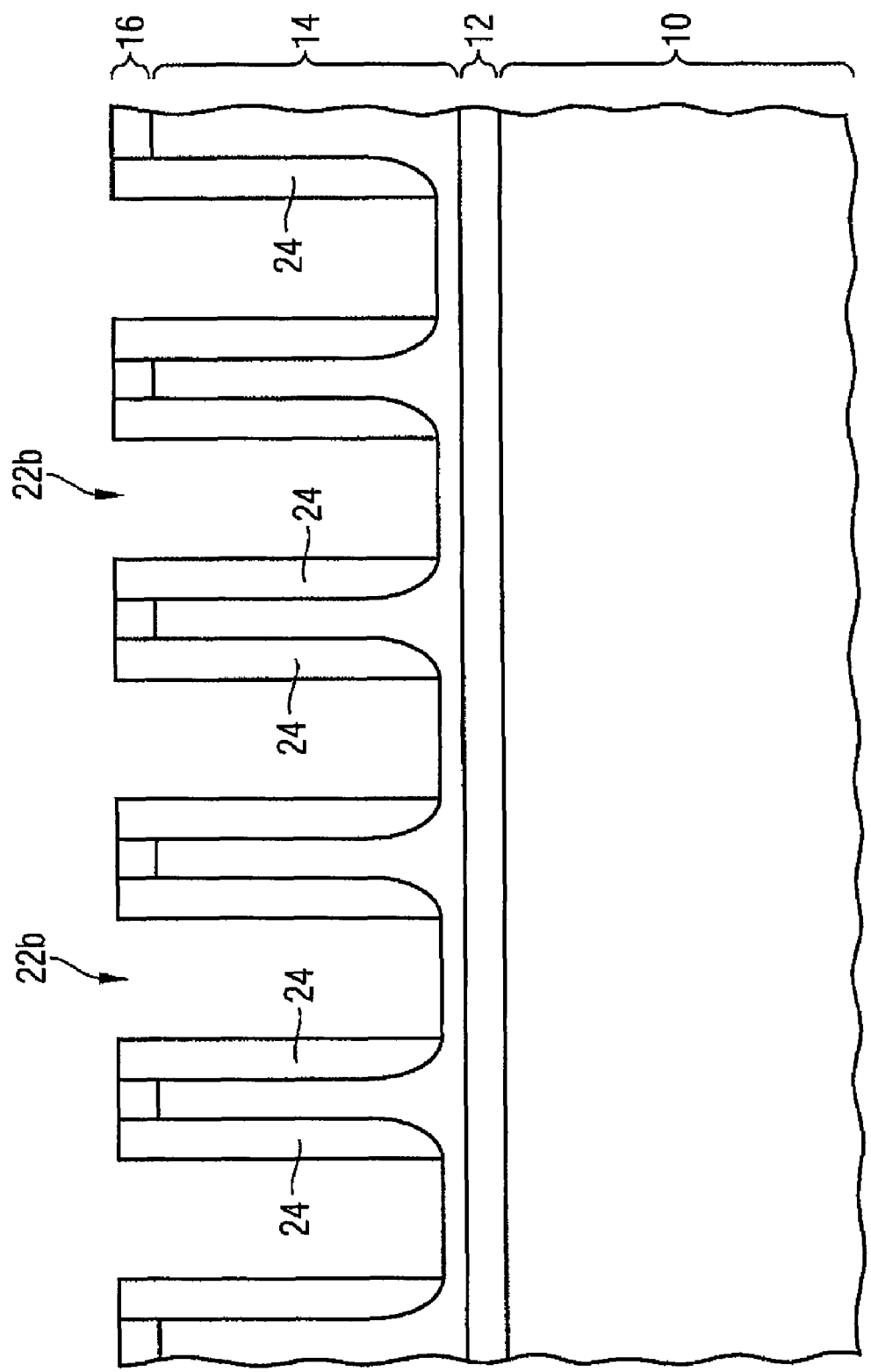

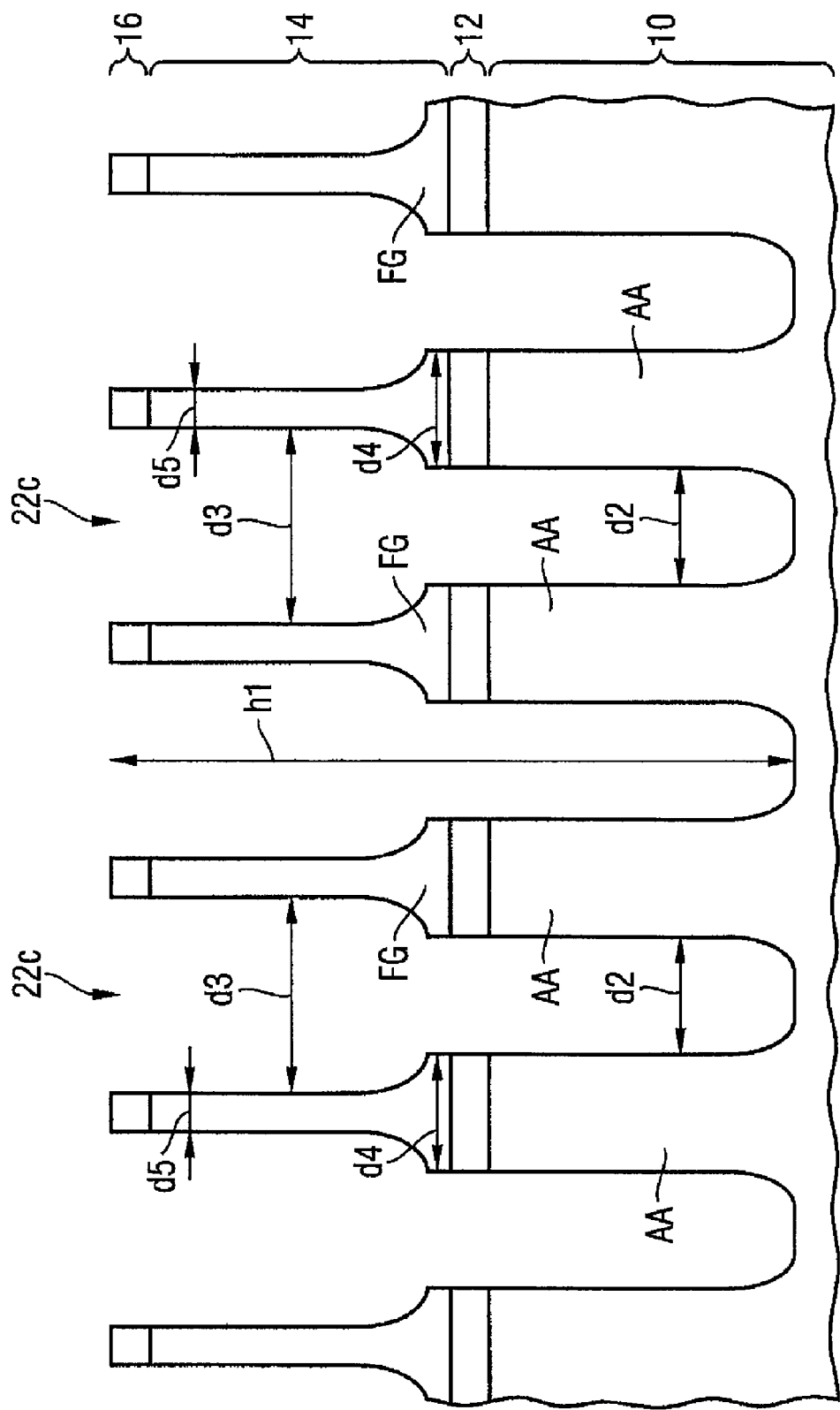

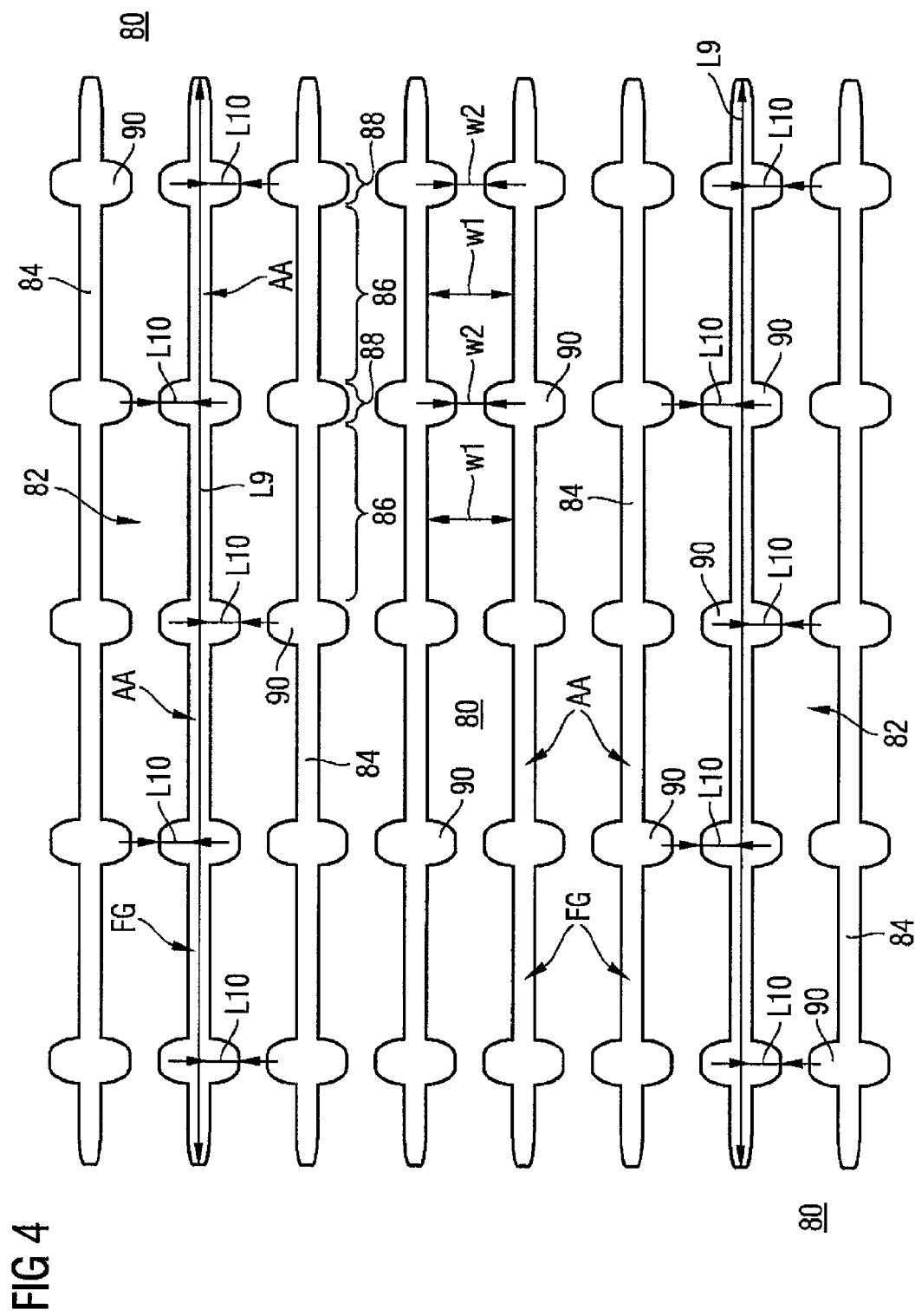

INTEGRATED CIRCUIT WITH AN ACTIVE AREA LINE HAVING AT LEAST ONE FORM-SUPPORTING ELEMENT AND CORRESPONDING METHOD OF MAKING AN INTEGRATED CIRCUIT

BACKGROUND

1. Field of Invention

This invention generally relates to an integrated circuit and to a method of making a corresponding integrated circuit.

2. Related Art

An integrated circuit may have at least one active area line with trenches on either side of the active area line. Such an integrated circuit is for instance a flash memory. A flash memory normally stores information in an array of floating-gate transistors, often called cells. One example for a flash memory is a NAND memory which uses tunnel injection for writing and tunnel release for erasing.

As manufacturers increase the density of data storage in flash devices, the size of an individual memory cell is shrinking. Also, the distance between two adjacent memory cells decreases.

However, the decrease of a component of an integrated circuit or of a distance between two adjacent components of the integrated circuit may result in a lack of stability. Therefore, it is a challenge to provide an integrated circuit that provides a high component density as well as a sufficient stability of its components.

SUMMARY

An integrated circuit is described. The integrated circuit may include: an active area line formed of a material of a semiconductor substrate with a first longitudinal direction parallel to an upper surface of the semiconductor substrate; wherein the active area line comprises at least one form-supporting element extending in a second longitudinal direction parallel to the upper surface of the semiconductor substrate; and wherein the second longitudinal direction is arranged with regard to the first longitudinal direction in an angle unequal to 0 degree and unequal to 180 degree.

Also, a method of making an integrated circuit is described. The method may include: forming an active area line of a material of a semiconductor substrate with a first longitudinal direction parallel to an upper surface of the semiconductor substrate; wherein at least one form-supporting element is formed of the material of the semiconductor substrate, the at least one form-supporting element extending in a second longitudinal direction parallel to the upper surface of the semiconductor substrate; and wherein the second longitudinal direction is arranged with regard to the first longitudinal direction in an angle unequal to 0 degree and unequal to 180 degree.

Moreover, another method of making an integrated circuit is described that may include: forming a plurality of trenches with a non-linear pattern into a surface of a semiconductor substrate.

Furthermore, another method of making an integrated circuit is described. The method may include: depositing an insulation layer on a semiconductor substrate; depositing a layer of floating-gate electrode material on the insulation layer; forming a plurality of trenches with a non-linear pattern; and filling the plurality of trenches with the non-linear pattern at least partially with an insulating material.

Other systems, methods, features and advantages of the invention will be or will become apparent to one with skills in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood by referring to the following figures. The components in the figures are not necessarily to scale, emphasis instead being placed upon illustrating the principles of the invention.

In the Figures:

FIGS. 1A-F illustrate a method of producing an integrated circuit, wherein FIGS. 1Aa-Ea show cross sections of a semiconductor structure and FIGS. 1Ab-Cb, Eb and Fb show plan views of the semiconductor structure;

FIG. 4 shows a plan view of a semiconductor structure for illustration another approach of the method.

DETAILED DESCRIPTION

In the following description, reference is made to the accompanying drawings that form a part hereof, and in which is shown by way of illustration one or more specific implementations in which the invention may be practiced. It is to be understood that other implementations may be utilized and structural changes may be made without departing form the scope of this invention.

Figure 1A:
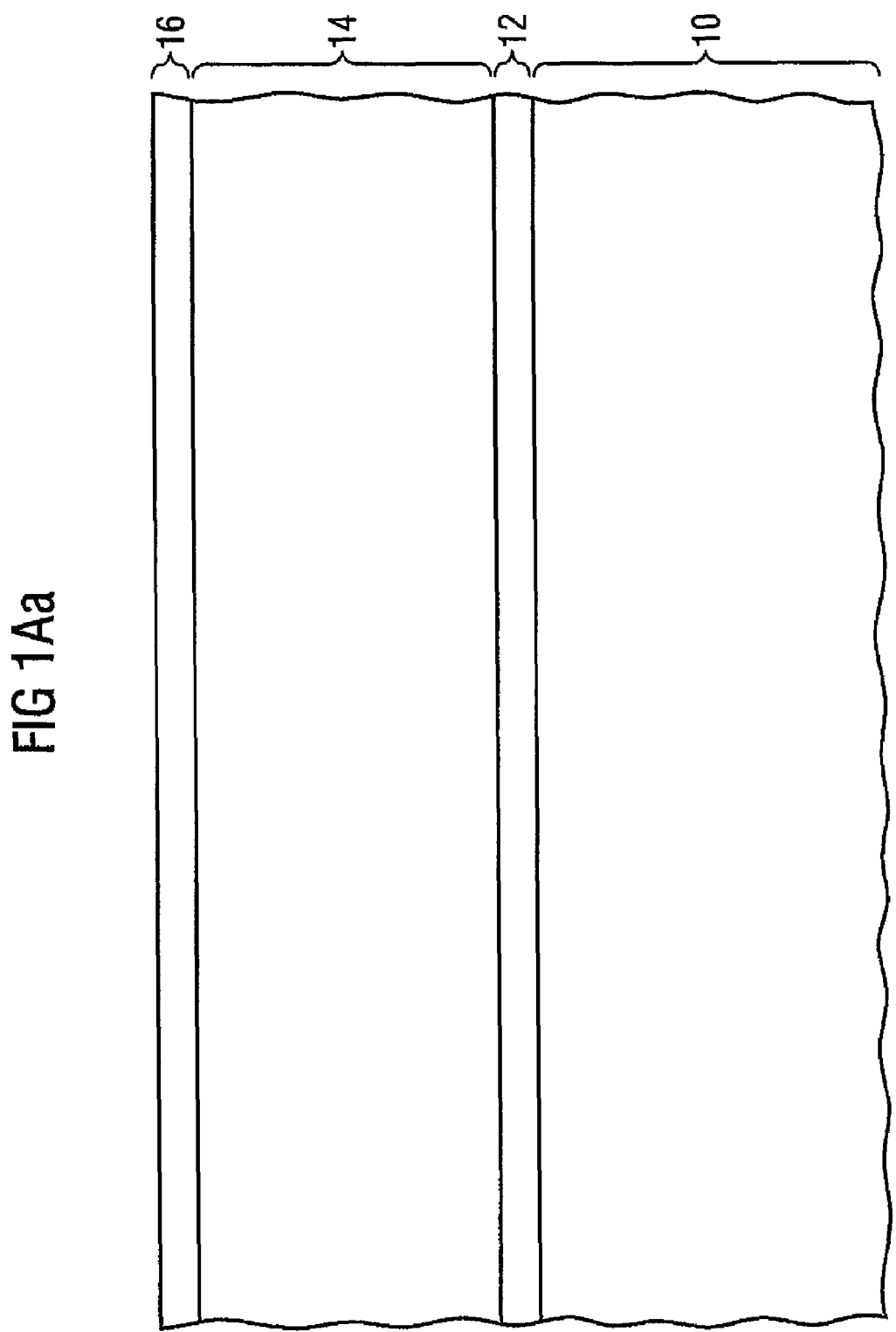
Figure 1A:
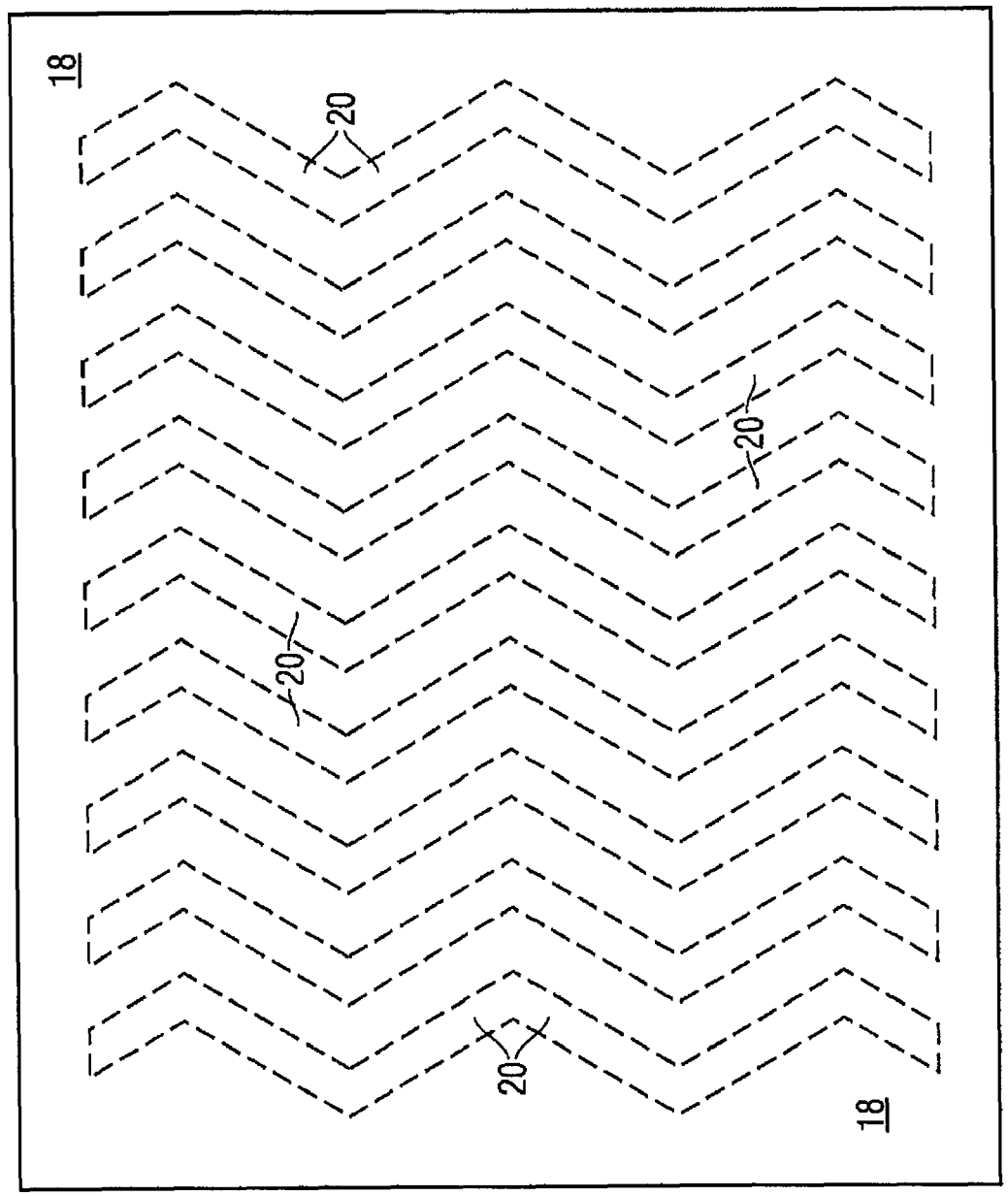

FIGS. 1A-F illustrate a method of producing a semiconductor memory device, wherein FIGS. 1Aa-Ea show cross sections of a semiconductor structure and FIGS. 1Ab-Cb, Eb and Fb show plan views of the semiconductor structure.

An insulation layer 12 is formed on a semiconductor substrate 10. For instance, the semiconductor substrate 10 may include silicon. The insulation layer 12 may include silicon oxide. In this case, the insulation layer 12 may be formed by heating the semiconductor substrate 10 in an oxygen atmosphere in a thermal oxidation step. However, the present technology is not restricted to the materials silicon and silicon oxide for the semiconductor substrate 10 and the insulation layer 12. For instance, various other insulating materials may be deposited on the semiconductor substrate 10 to serve as insulation layer 12. The layer thickness of the insulation layer 12 may be about 10 nm.

Then, a layer of floating-gate electrode material 14, for instance a polysilicon layer, is deposited on the insulation layer 12. The layer thickness of the layer of floating-gate electrode material 14 may be in a range between 30 nm to 100 nm. On the surface of the layer of floating-gate electrode material 14, a nitride layer 16 is deposited. The result is shown in FIG. 1Aa.

In a following process step, a mask 18 is deposited on the surface of nitride layer 16. Then, zigzag-shaped areas 20 (shown in FIG. 1Ab) of the mask 18 are exposed in a lithographic step. Thus, a non-linear pattern is provided on the surface of nitride layer 16.

The present technology is not limited to the exposure of zigzag-shaped areas 20 in a lithographic step. As an alternative, the exposed areas 20 may have other non-linear shapes. Thus, the non-linear pattern provided on the surface of nitride layer 16 may also have exposed areas 20 with an undulating shape. It may be that exposed areas 20 of the non-linear pattern are at a constant distance along a major portion of their length, even though they are non-linear.

Also, it is possible to choose different forms for the exposed areas 20 of the non-linear pattern. For example, some of the exposed areas 20 of the non-linear pattern may be zigzag-shaped while others are undulating-shaped. However, it is clearly expressed here, that due to reasons explained below, the exposed areas 20 do not resemble straight lines.

In a subsequent process step, a first reactive ion etch (RIE) step is performed to etch zigzag-shaped trenches 22a through the nitride layer 16 and into the layer of floating-gate electrode material 14. Thus, a plurality of trenches with a non-linear pattern is formed into the surface of substrate 10. The result of this first RIE step is shown (without the mask 18) in FIG. 1Ba and in FIG. 1Bb.

Figure 1B:
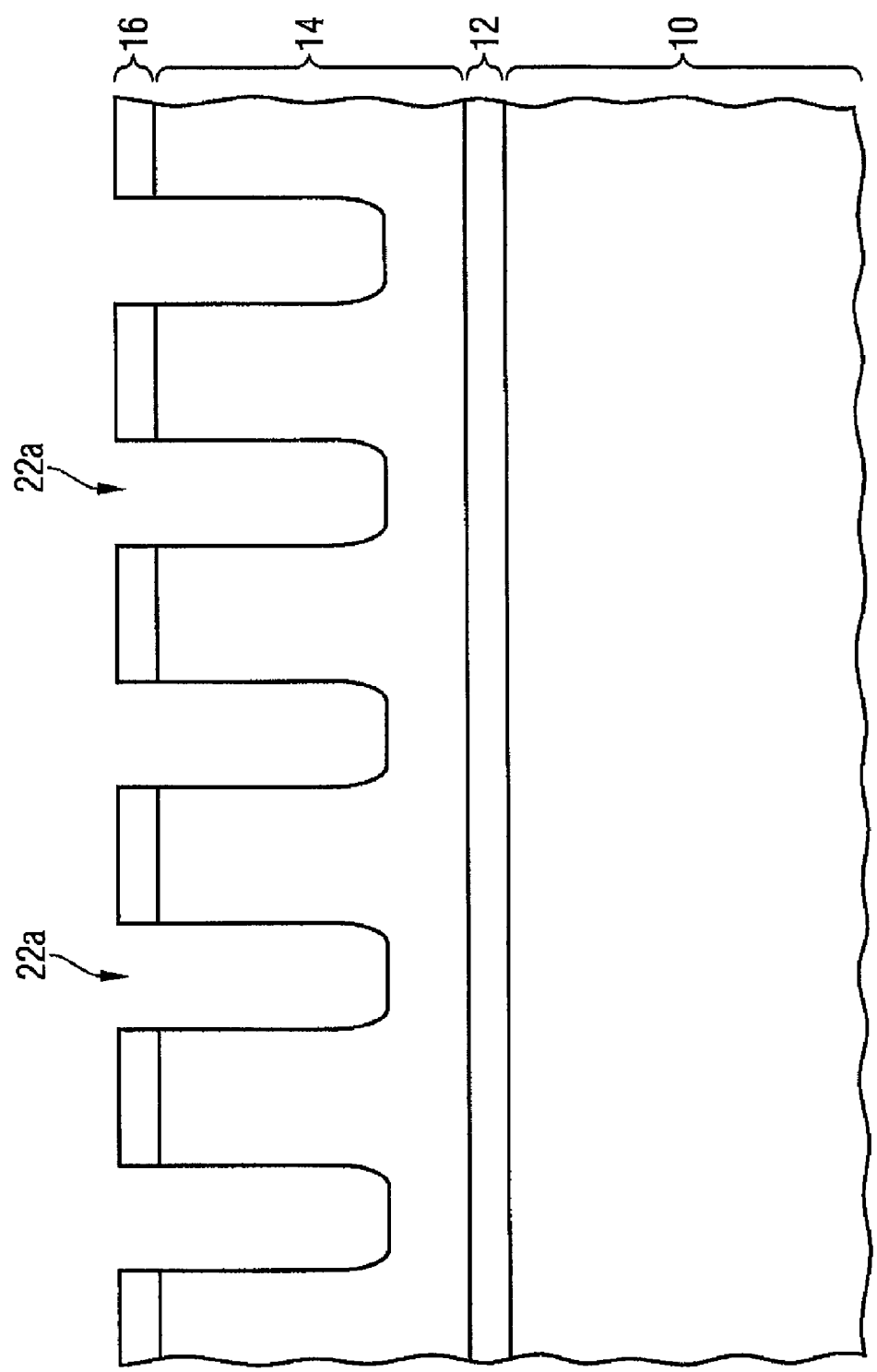
Figure 1B:
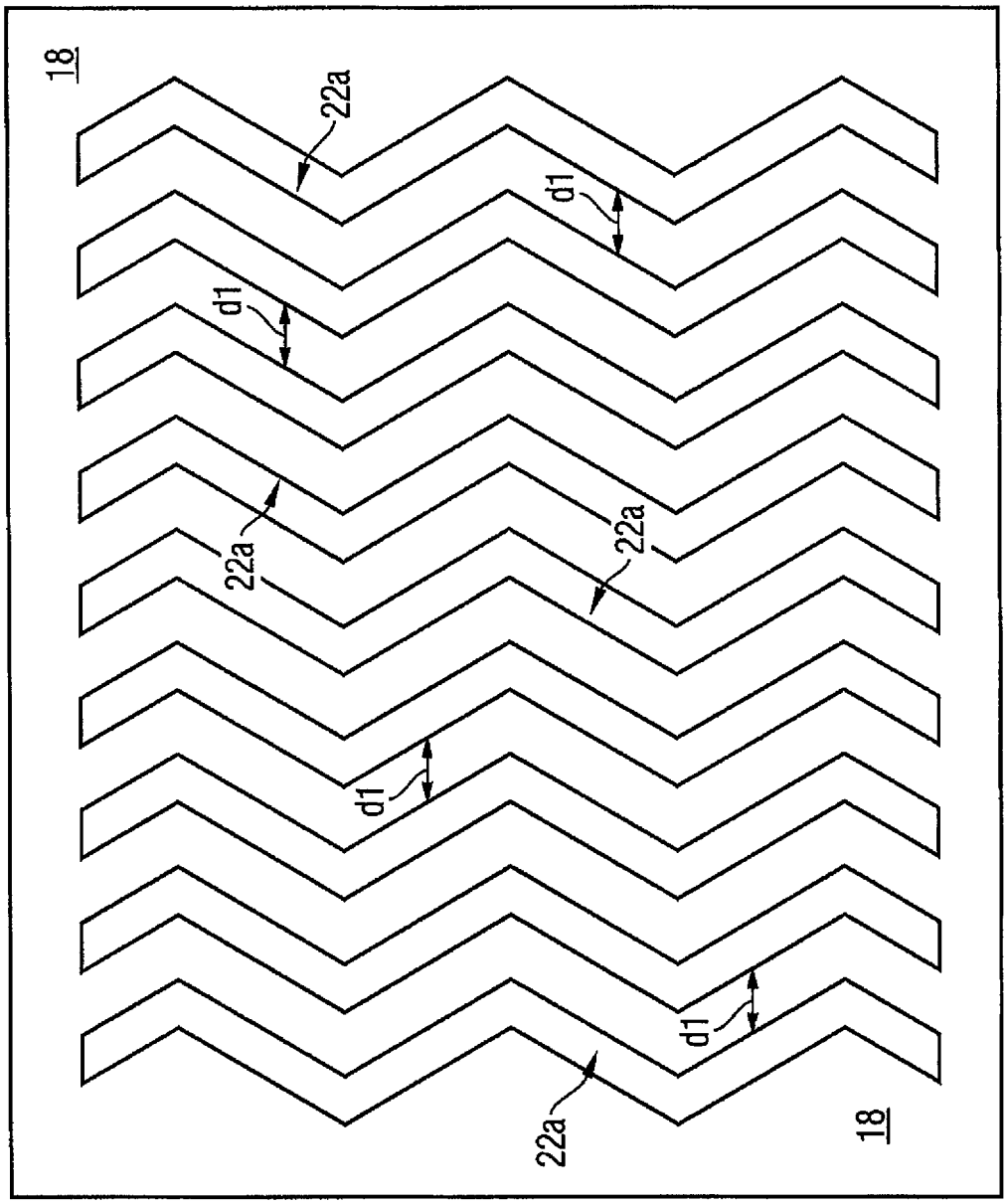

The zigzag-shaped trenches 22a of the non-linear pattern shown in FIGS. 1Ba and Bb are parallel and equidistant from each other. The distance d1 between two adjacent trenches 22a is typically in the range between 20 nm to 100 nm.

Of course, it is also possible to expose a pattern of non-linear areas 20 of the mask 18 that are not parallel to each other. Thus, a pattern of non-parallel trenches 22a may be etched by the first RIE step. In case that another non-straight shape is chosen for the exposed areas 20, the etched trenches 22a have another non-straight shape. Thus, many different forms of non-straight trenches 22a and many varieties of a non-linear pattern may be etched.

Figure 1C:
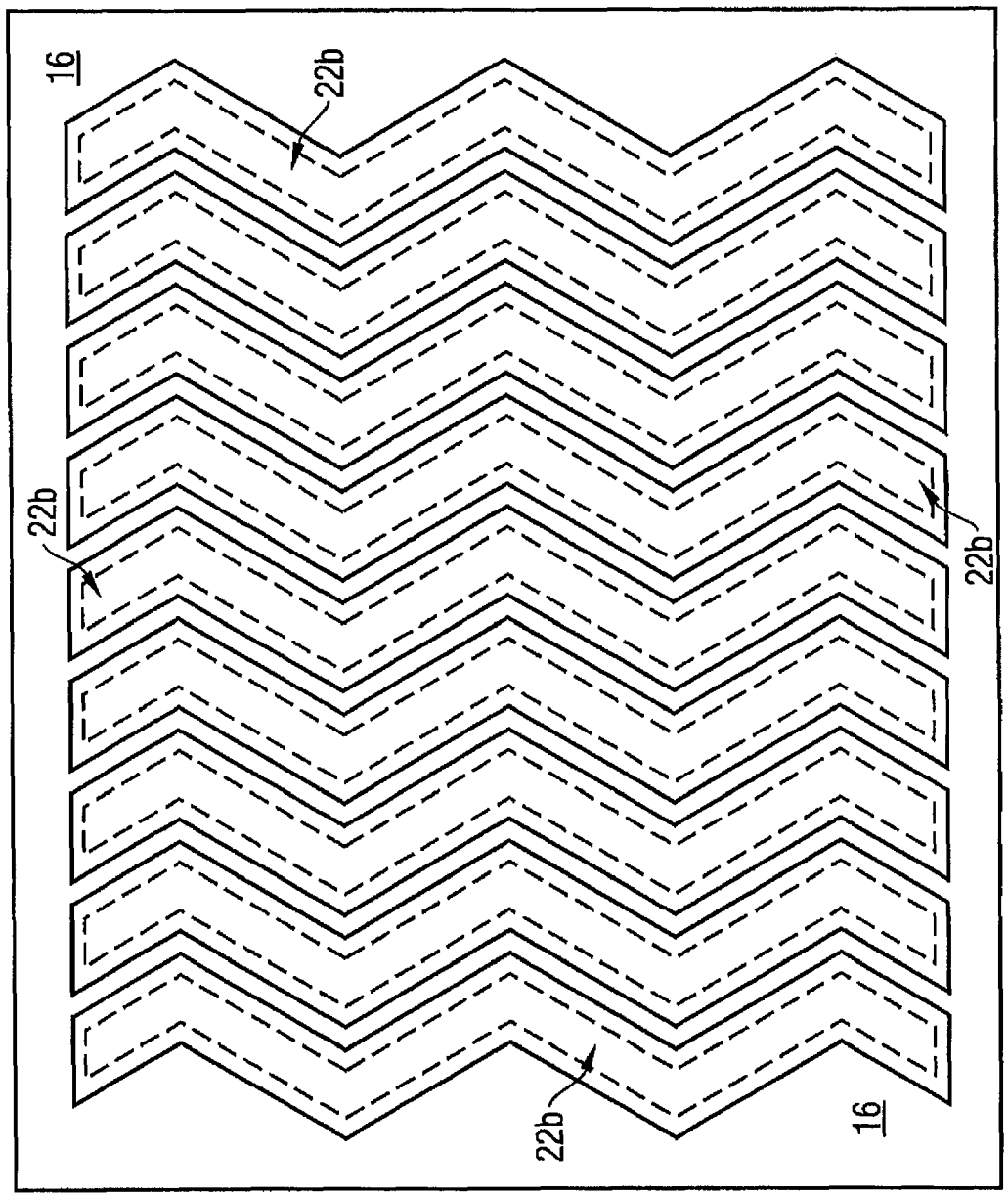

Then, an isotropic etch step is carried out. This isotropic etch step is performed to increase the width of the trenches 22a etched by the first RIE step (shown in FIGS. 1Ca and 1Cb in broken lines). The depth of the new-formed trenches 22b may hardly or not be increased by the isotropic etch step, as can be seen from FIG. 1Ca. After the isotropic etch step, the mask 18 is removed, and the result is shown in FIGS. 1Ca and 1Cb.

The trenches 22b are filled with an insulating material. The insulating material may be a silicon nitride. Then, a chemical mechanical polishing (CMP) step may be performed to remove the insulation material protruding above the nitride layer 16. In a subsequent process step, another (not shown) mask is deposited on the surface of the nitride layer 16. The mask is exposed at the sites of the areas 20 of the first lithographic step. Then, an anisotropic etch step is carried out to remove some of the insulating material filled into the trenches 22b till the bottoms of the trenches 22b are exposed. However, the insulating material covering the sidewalls of the trenches 22b is not removed. Thus, this anisotropic etch step results in the formation of spacers 24 made of the insulating material, as can be seen from FIG. 1Da.

Then, a second RIE step is carried out to increase the depth of the trenches 22b. During this second RIE step, the spacers 24 may protect the sidewalls of the trenches 22b and consequently inhibit the removal of material from the sidewalls of the trenches 22b.

Thus, new trenches 22c which extend through the insulation layer 12 into the semiconductor substrate 10 are formed. These newly etched trenches 22c have a lower part with a lower width d2 and an upper part with an upper width d3. The upper width d3 may be larger than the lower width d2, as can be seen from FIG. 1Ea. The total height h1 of the trenches may be between 200 nm to 600 nm. The height of the lower part of the trenches 22c may be for example in a range between 150 nm to 300 nm. The upper part of the trenches 22c may have a height in a range between 50 nm to 300 nm.

Further, the spacers 24 are removed. The result is shown in FIGS. 1Ea and 1Eb.

Figure 1E:
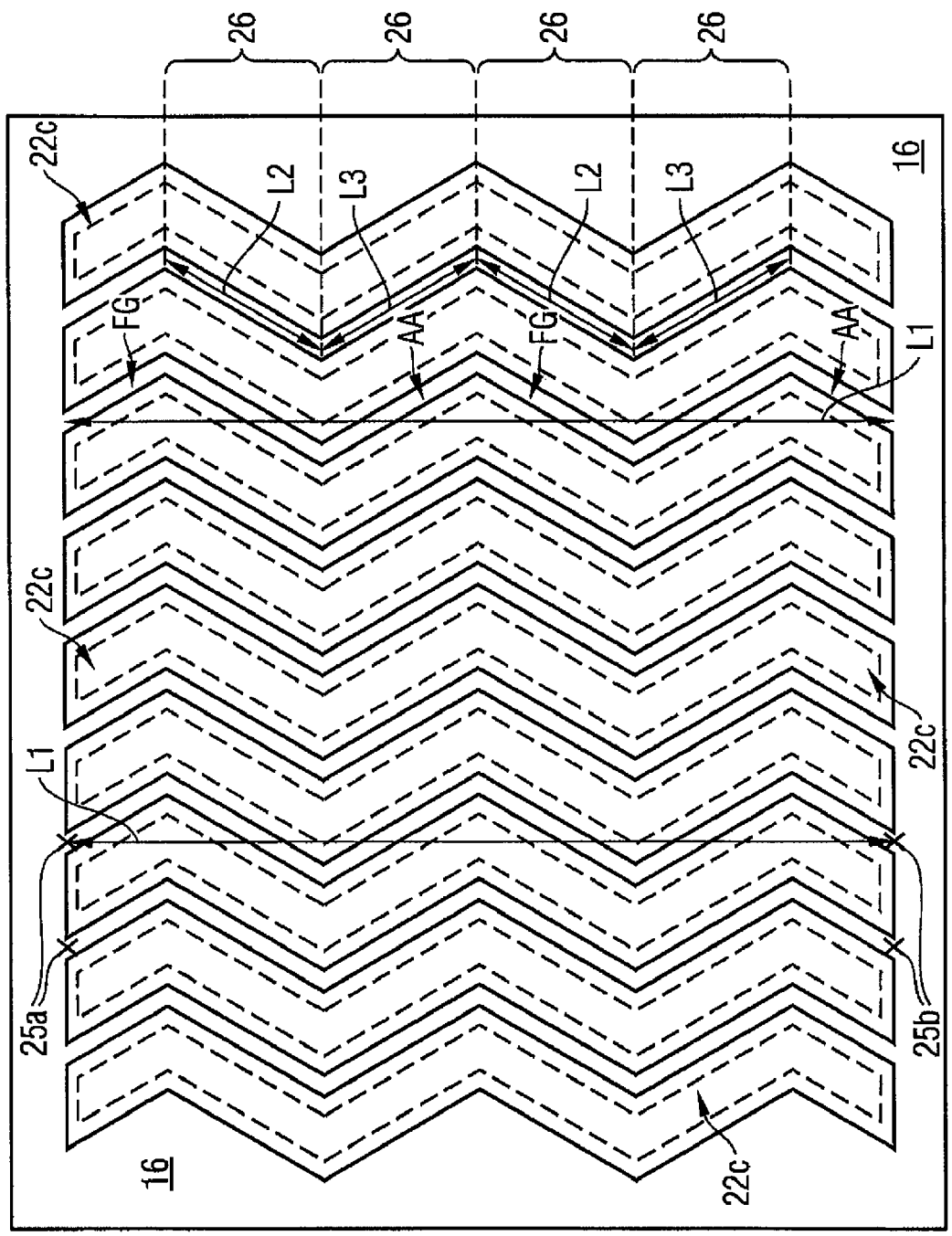

FIG. 1Ea also shows the floating-gate electrodes FG formed of the layer of floating-gate electrode material 14. These floating-gate electrodes FG are separated from the active area lines AA by the insulation layer 12. The floating-gate electrodes FG have a lower width d4 which is in a range between 30 nm to 100 nm. The upper width d5 of the floating-gate electrodes FG is about 10 nm.

Due to the inverse T-shape of the floating-gate electrodes FG, the interaction between two floating-gate electrodes FG arranged next to each other in a direction perpendicular to the cross-section of the FIGS. 1Aa-Ea may be reduced. The interaction between a floating-gate electrode FG and its associated (in a following process step to be formed) control-gate electrode may not be limited by the inverse T-shape of the floating-gate electrode FG.

The active area lines AA below the strings of floating-gate electrodes FG are also shown in FIG. 1Ea. Each of the active area lines AA is made of a material of the semiconductor substrate 10.

As can be seen from FIG. 1Eb, the newly formed active area lines AA and the strings of floating-gate electrodes FG have a zigzag shape. The zigzag shape of the active area lines AA and the strings of floating-gate electrodes FG may increase the stiffness of the active area lines AA and the floating-gate electrodes FG. Thus, the risk that the active area lines AA or the floating-gate electrodes FG might bend or even break may be reduced compared to a case in which a conventional non-zigzag structure is used. Therefore, the upper width d5 of the floating-gate electrodes FG may be smaller than the lower width d4. Furthermore, the width of the active area lines AA which is equal to the lower width d4 may be relatively small.

For each of the active area lines AA and the strings of floating-gate electrodes FG a first longitudinal direction L1 parallel to the upper surface of the semiconductor substrate 10 is definable. The first longitudinal direction L1 of each active area line AA extends from a first end point 25a of the active area line AA near to a first side of the semiconductor substrate 10 to a second end point 25b of the active area line AA near to a second side of the semiconductor substrate 10. The second side is arranged opposite to the first side of the semiconductor substrate 10. The first longitudinal direction L1 of each string of floating-gate electrodes FG is definable in similar way.

Each of the active area lines AA and the strings of floating-gate electrodes FG has a plurality of form-supporting elements 26. Each of the form-supporting elements 26 extends straight in a second or third longitudinal direction L2 or L3 parallel to the upper surface of the semiconductor substrate 10, wherein the second or third longitudinal direction L2 or L3 is arranged with regard to the first longitudinal direction L1 in an angle unequal to 0 degree and unequal to 180 degree.

The straight form-supporting elements 26 are arranged to each other in a way to form a zigzag-shaped line. However, the present technology is not restricted to straight form-supporting elements 26. For instance, an active area line AA or a string of floating-gate electrodes FG may also have a plurality of non-straight form-supporting elements that are arranged to each other in a way to form an undulating-shaped line.

Due to the plurality of form-supporting elements 26 the active area line AA or the string of floating-gate electrodes FG have a form-supporting shape.

In a following process step, the trenches 22c are partially filled with an insulating material, for example silicon oxide. Then, the control-gate electrodes are formed within the upper parts of the trenches 22c and above the active area lines AA and the floating-gate electrodes FG. For instance, the control-gate electrodes may include polysilicon.

Then, layers of wordline material, for example a tungsten nitride layer and a tungsten layer, are deposited above the control-gate electrodes. A mask is deposited on the layers of wordline material and some areas of the mask are exposed. Then, an etch step is performed to form wordlines WL which are separated from each other by interspaces.

Figure 1F:
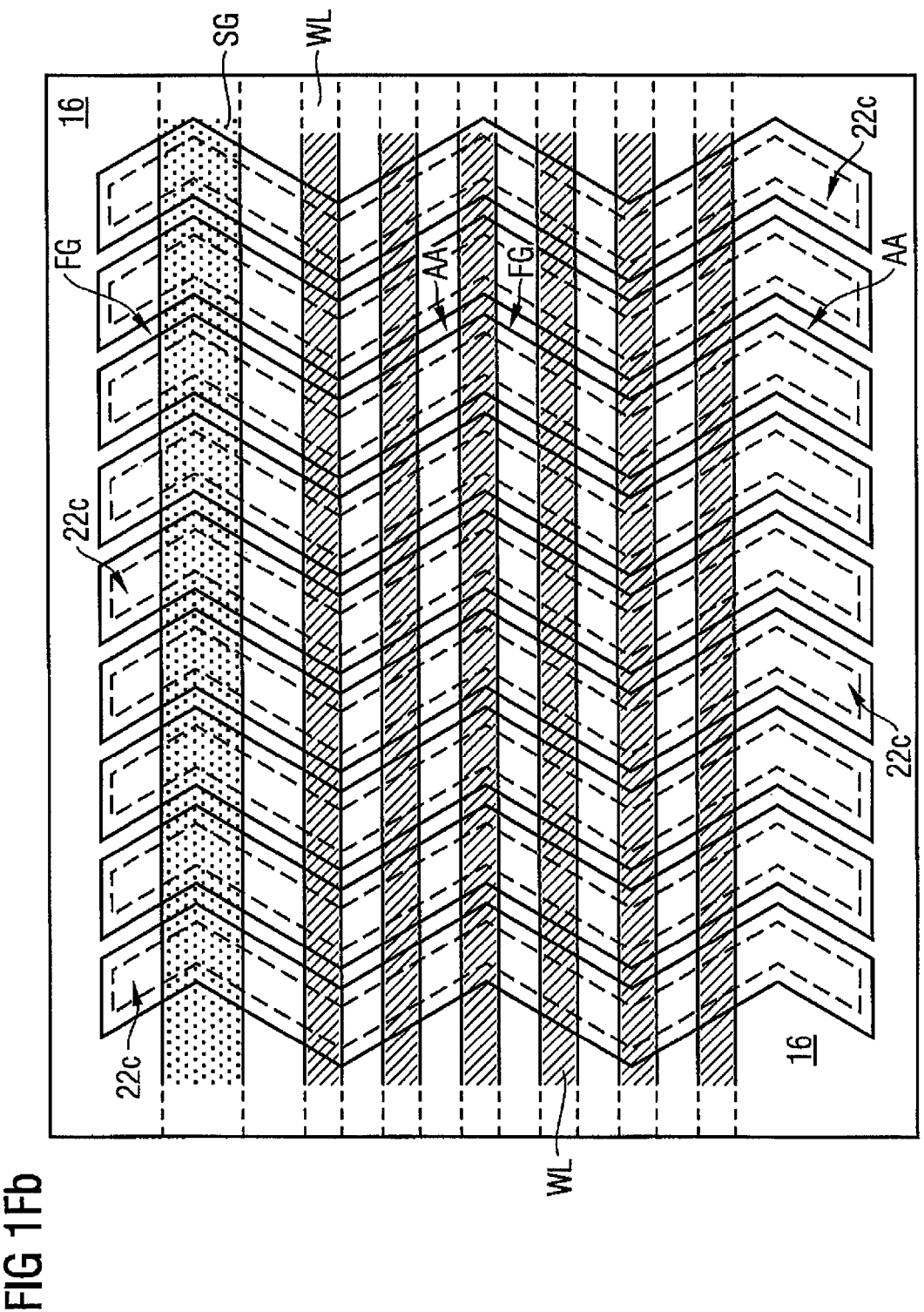

FIG. 1Fb shows the base areas of the wordlines WL in an intermediary state when the wordlines WL are already separated from each other. In a following etch steps, single floating-gate electrodes FG are etched of the material of the strings of floating-gate electrodes FG. After this etch step, only the material of the strings of floating-gate electrodes FG which is protected by the mask above the wordlines WL is left on the semiconductor substrate. Bitlines BL may be formed to have base areas which correspond to the base areas of the floating-gate electrodes FG located below the bitlines BL. However, to provide a good lucidity, the bitlines BL are not shown in FIG. 1Fb.

Then, the other components of a NAND memory circuit, for instance a select gate SG, a source line and bitline contacts, are mounted on the semiconductor substrate 10. This is illustrated in FIG. 1Fb with the example of the shown base area of the select gate SG. However, due to the fact that the methods of forming these NAND components are known as prior art, they are not explained here.

Figure 2A:
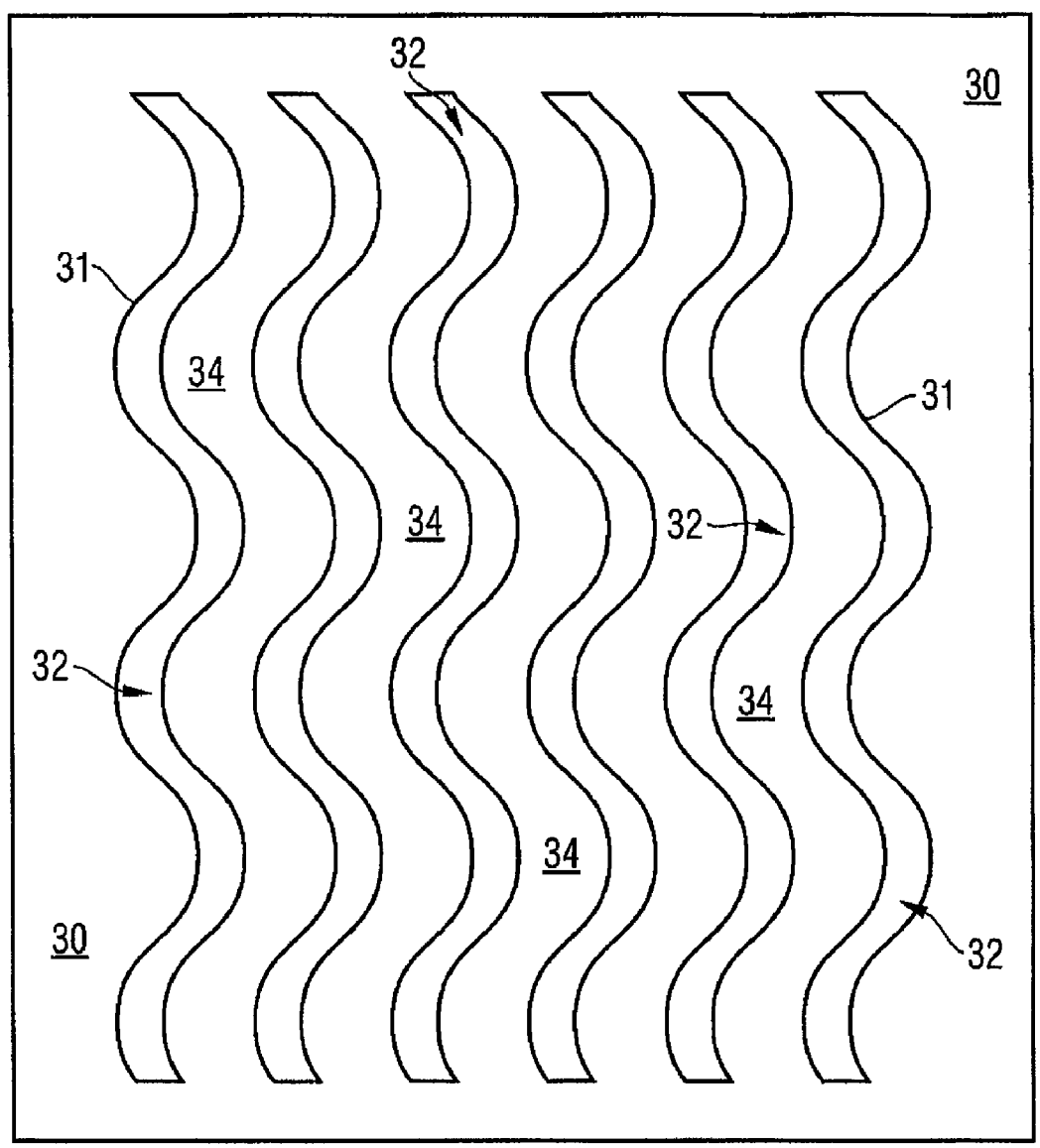
FIGS. 2A-C show plan views of a semiconductor structure for illustrating another approach of the method.
Figure 2B:
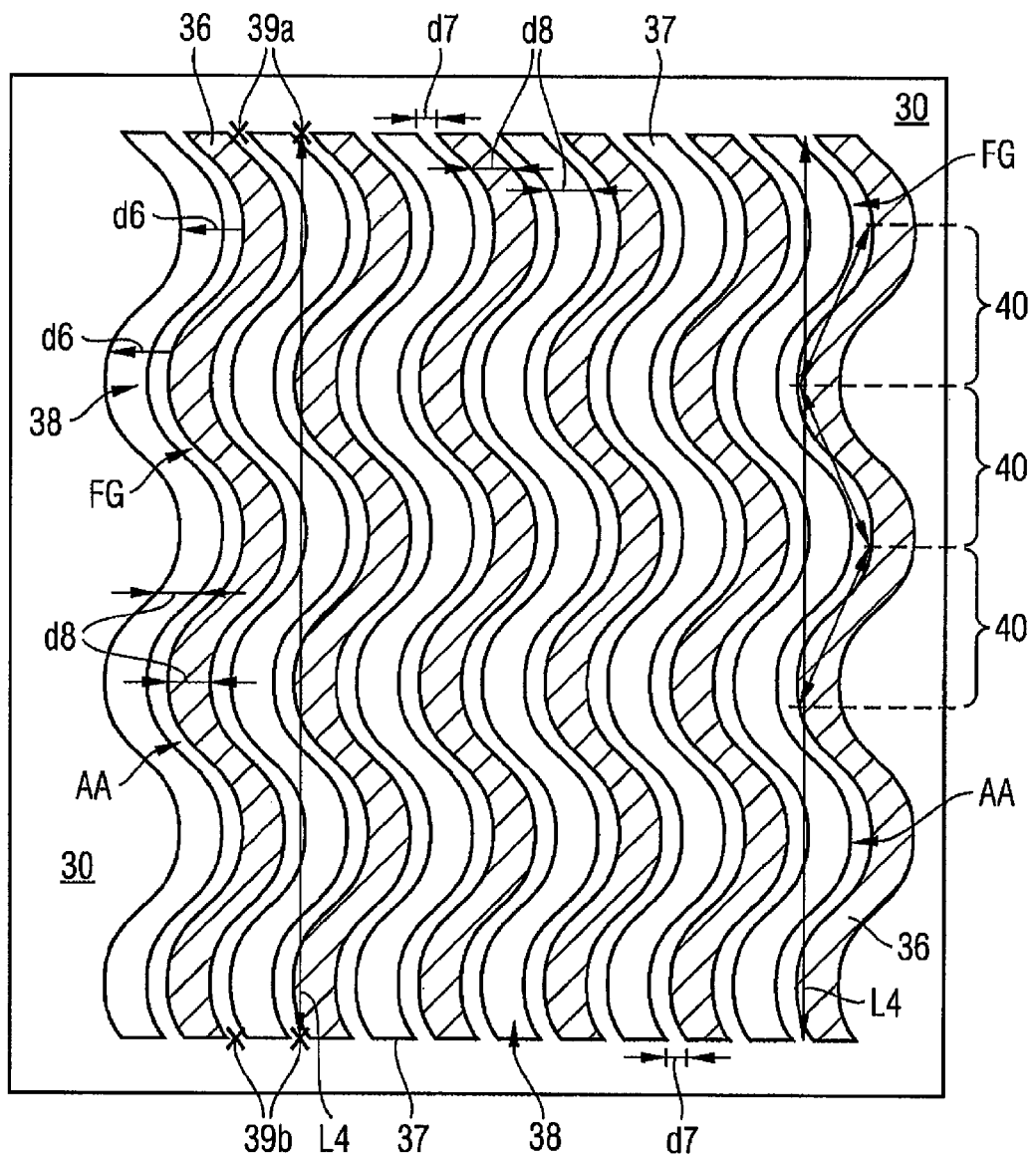
Figure 2C:
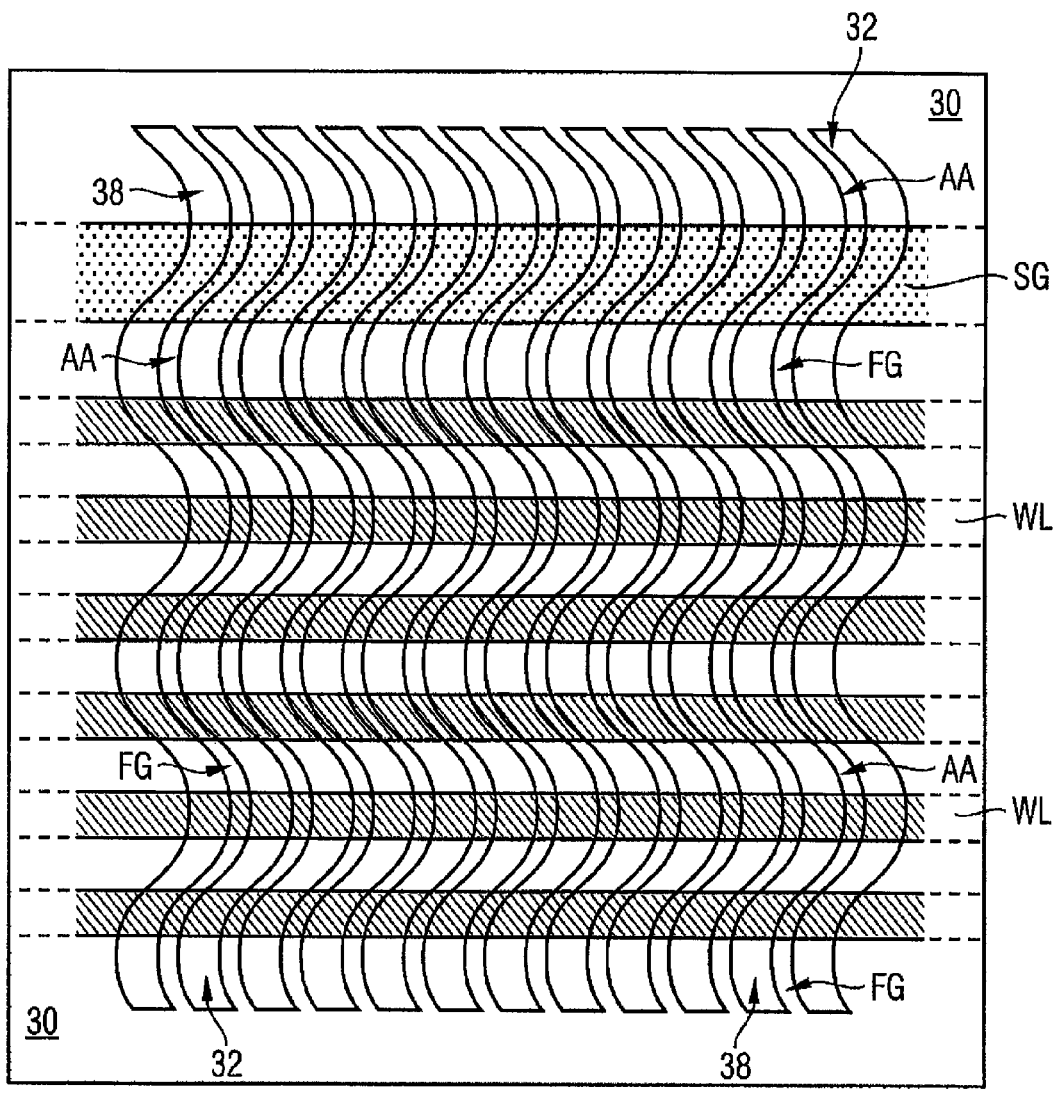

FIGS. 2A-C show plan views of a semiconductor structure for illustrating another approach of the method of producing a semiconductor memory device.

The semiconductor structure 30 shown in FIG. 2A includes a semiconductor substrate, an insulation layer formed on the semiconductor substrate and a layer of floating-gate electrode material deposited on the insulation layer. The upper layer of the semiconductor structure 30 is a (not shown) first mask, for instance a carbon hard mask.

In a first lithographic step, several undulating-shaped areas 31 of the first mask are exposed. The undulating-shaped areas 31 form a non-linear pattern on semiconductor structure 30. The patterned first mask is then used in a first etch step to etch a first plurality of insulation trenches 32 into the substrate of the semiconductor structure 30. Thus, the first plurality of insulation trenches 32 with a non-linear pattern is provided on semiconductor structure 30. Then the first mask is removed and the result is shown in FIG. 2A.

All the insulation trenches 32 of the non-linear pattern have an undulating shape, as can be seen in FIG. 2A. Therefore, the interspaces 34 between the first plurality of insulation trenches 32 also have an undulating shape.

Then, the first plurality of insulation trenches 32 is filled with an insulating material 36, for instance silicon oxide. In a next process step, a (not shown) second mask is deposited on the semiconductor structure 30. In a second lithographic step, undulating-shaped areas 37 of the second mask, which are shifted from the exposed areas 31 of the first lithographic step for a distance d6, are exposed. Then, a second etch step is carried out to etch a second plurality of insulation trenches 38 with a non-linear pattern into the former interspaces 34 of the first plurality of insulation trenches 32, as can be seen from FIG. 2B.

Between each two adjacent insulation trenches of the first plurality 32, one trench of the second plurality 38 is arranged. In the interspaces between the first and the second plurality of insulation trenches 32 and 38 active area lines AA are formed of the material of the semiconductor substrate. Furthermore, strings of floating-gate electrodes FG are formed of the former layer of floating-gate electrode material.

The active area lines AA and the strings of floating-gate electrodes FG have an undulating shape corresponding to the undulating shape of the insulation trenches 32 and 38. Therefore, each of the active area lines AA and the strings of floating-gate electrodes FG has a form-supporting shape.

The width d7 of the floating-gate electrodes FG may be smaller than the width d8 of the insulation trenches 32 and 38. However, due to the undulating shape of the newly formed floating-gate electrodes FG, the stiffness of the floating-gate electrodes FG is increased. Therefore, the risk that these floating-gate electrodes FG might bend or even break is reduced.

For each of the active area lines AA a first longitudinal direction L4 parallel to the upper surface of the semiconductor substrate 10 is definable, wherein the first longitudinal direction L4 extends from a first end point 39a of the active area line AA to a second end point 39b of the active area line AA. The first longitudinal direction L4 of the strings of floating-gate electrodes FG is also definable.

Furthermore, for each active area line AA a plurality of non-straight form-supporting elements 40 is definable. Each of the form-supporting elements has a longitudinal direction that is arranged with regard to the first longitudinal direction L4 in an angle unequal to 0 degree and unequal to 180 degree. The non-straight form-supporting elements 40 are arranged to each other in a way to form an undulating-shaped line. However, as has been explained above, the pre-sent technology is not restricted to non-straight form-supporting elements 40.

Of course, form-supporting elements are also definable for the strings of floating-gate electrodes FG in a similar way.

The possibility of a bending or breaking of the active area lines AA and the strings of floating-gate electrodes FG may be further decreased by forming the active area lines AA and the strings of floating-gate electrodes FG in a two step etch procedure. The insulating material 36 filled into the first plurality of insulation trenches 32 limits the oscillations of its two adjacent active area lines AA and its two adjacent strings of floating-gate electrodes FG. Thus, the insulating material 36 filled into the first plurality of insulation trenches 32 also increases the stability of the active area lines AA and the floating-gate electrodes FG.

In the following process steps, control-gate electrodes are formed within the insulation trenches 32 and 38 and above the floating-gate electrodes FG. Then, wordlines WL are arranged above the control-gate electrodes. The base areas of the wordlines WL are shown in FIG. 2C.

FIG. 2C shows the semiconductor substrate in an intermediary state after an etching step to form the wordlines WL of the layers of wordline material deposited over the whole surface of the semiconductor substrate. In the following process steps, the parts of the strings of floating-gate electrodes FG which are exposed in the interspaces of the wordlines WL are etched away to form single floating-gate electrodes FG arranged under the wordlines WL.

In another process step, bitlines BL may be formed on the floating-gate electrodes FG so that the base areas of the bitlines BL correspond to the base areas of the active area lines AA and the floating-gate electrodes FG. Further, the other components of a NAND memory circuit are formed on the semiconductor structure 30. However, to provide a good lucidity, only the select gate SG is shown in FIG. 2C as an example for the components still to be formed on the semiconductor structure 30.

In the paragraphs above, two examples of a plurality of trenches with a non-linear pattern are described. However, it is also possible to provide a non-linear pattern on a substrate that includes for instance a combination of zigzag-shaped trenches and undulating-shaped trenches.

Figure 3A:
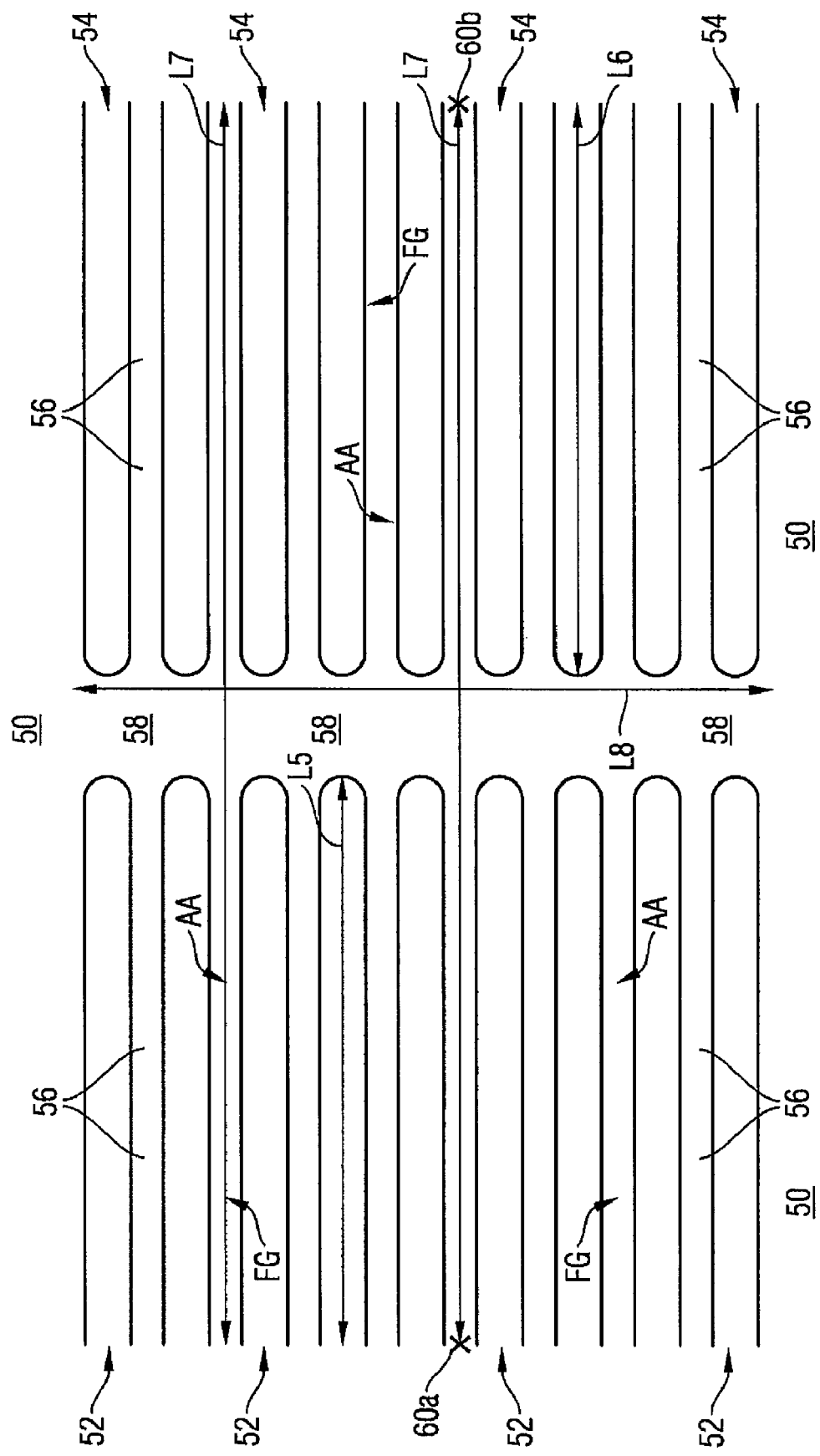
FIGS. 3A and B show plan views of a semiconductor structure for illustrating another approach of the method.

FIGS. 3A and B show plan views of a semiconductor structure for illustrating another approach of the method.

FIG. 3A shows a plan view of a semiconductor structure 50. The semiconductor structure 50 includes an insulation layer, a layer of floating-gate electrode material provided on the insulation layer and a nitride layer formed on the layer of floating-gate electrode material. Examples for the materials and the layer thicknesses of the insulation layer, the layer of floating-gate electrode material and the nitride layer are given above. However, to provide a good lucidity, the insulation layer, the layer of floating-gate electrode material and the nitride layer are not shown in FIG. 3A.

A first and a second plurality of trenches 52 and 54 are etched into the surface of the semiconductor structure 50. The first plurality of trenches 52 is etched into a first half of the surface of the semiconductor structure 50. The trenches 52 may run parallel to each other. Furthermore, the trenches 52 may be equidistant from each other. All the trenches 52 have a length L5 smaller than the width of the first half of the semiconductor structure 50. No trench 52 extends into the second half of the surface of the semiconductor structure 50.

The second plurality of trenches 54 may be etched in a similar way into the second half of the surface of the semiconductor structure 50. The trenches 54 may have a length L6 that is smaller than the width of the second half. Thus, no trench 54 may extend into the first half of the surface of the semiconductor structure 50. For instance, the length L6 may be equal to the length L5.

The trenches 52 and 54 extend into the substrate of the semiconductor structure 50. The total height of the trenches 52 and 54 may be between 200 nm to 600 nm. Thus, active area lines AA are formed in the interspaces 56 between two adjacent trenches 52 and between two adjacent trenches 54. The active area lines AA are formed of a part of the material of the substrate. Furthermore, strings of floating-gate electrodes FG are formed of the layer of floating-gate electrode material. The not-etched parts of the insulation layer separate the active area lines AA from the strings of floating-gate electrodes FG.

The trenches 52 and 54 may have a lower part and an upper part, wherein the width of the lower part is smaller than the width of the upper part. Furthermore, the trenches 52 and 54 may be etched in at least two etch steps, as explained above. The trenches 52 and 54 may also be etched as STI trenches which are interrupted by active area bars interconnecting adjacent active area lines AA.

The present technology is not restricted to straight trenches 52 and 54. Instead, the trenches 52 and 54 may also have a zigzag shape or an undulating shape.

The trenches 52 do not contact the trenches 54. Instead a form-supporting element 58 is formed, wherein the trenches 52 and 54 do not extend through the form-supporting element 58.

The form-supporting element 58 may extend through all the active area lines AA and the strings of floating-gate electrodes FG of the interspaces 56. Thus, the active area lines AA and the strings of floating-gate electrodes FG contact the form-supporting element 58. Therefore, the form-supporting element 58 may increase the stability of the active area lines AA and the strings of floating-gate electrodes FG. For instance, the form-supporting element 58 may inhibit a bending or a breaking of the active area lines AA or of the strings of floating-gate electrodes FG.

The form-supporting element 58 includes a first subunit formed of the material of the substrate and a second subunit formed of the layer of floating-gate electrode material. Thus, the first subunit of the form-supporting element 58 is a part of the solid unity of the active area lines AA. Moreover, the second subunit is a part of the solid unity of the strings of floating-gate electrodes FG. This may increase the stability of the active area lines AA and of the strings of floating-gate electrodes FG further. The two subunits are not shown in FIG. 3A.

A first longitudinal direction L7 of the active area lines AA and the strings of the floating-gate electrodes FG is definable. For instance, the first longitudinal direction L7 is defined by a first end point 60a of an active area line AA and a second end point 60b of the active area line AA. The first longitudinal direction L7 is parallel to the upper surface of the semiconductor structure 50. A second longitudinal direction L8 of the form-supporting element 58 parallel to the upper surface of the semiconductor substrate 12 is also definable. The second longitudinal direction L8 is arranged with regard to the first longitudinal direction L7 in an angle unequal to 0 degree and unequal to 180 degree. For instance, the second longitudinal direction L8 runs perpendicular to the first longitudinal direction L7.

The form-supporting element 58 includes a plurality of active area bars that interconnect adjacent active area lines AA. The active area bars may be arranged with regard to each other in a way to form a straight line. The width of the active area bars may be larger than the width of the trenches 52 and 54.

Figure 3B:
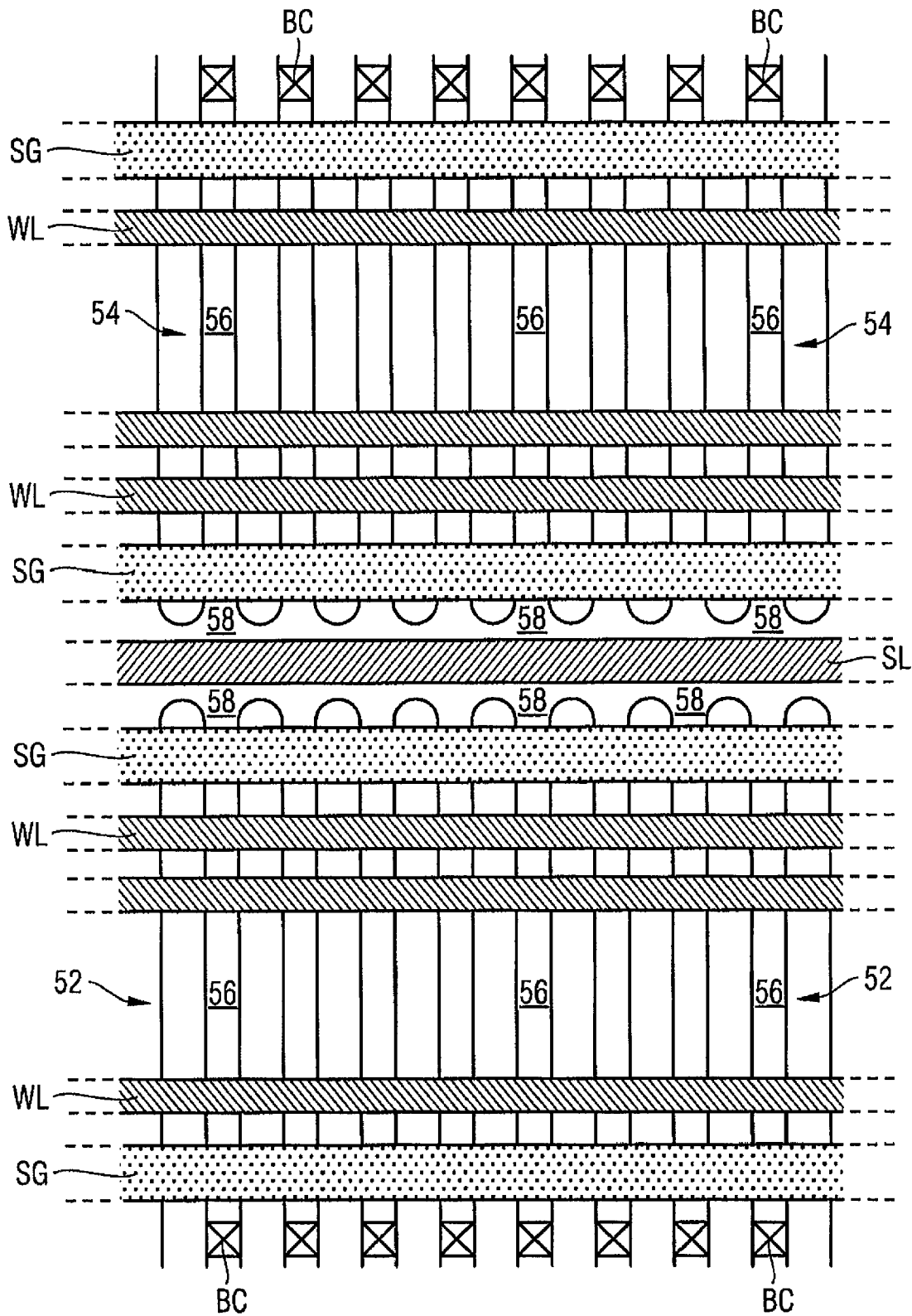

FIG. 3B shows a plan view of the semiconductor structure 50 after the formation of wordlines WL, select gates SG, bitline contacts BC and a source line SL.

The source line SL may be formed after the wordlines WL, the select gates SG as well as the source/drain junctions of the array transistor have been fabricated. The frequency and the position of the form-supporting element 58 may coincide with the position of the source line SL. Thus, the source line SL covers the form-supporting element 58 at least partially. Therefore, the formation of the form-supporting element 58 extending through the plurality of active area lines AA and the strings of floating-gate electrodes FG does not require additional space on the surface of the semiconductor structure 50.

FIG. 4 shows a plan view of a semiconductor structure for illustration another approach of the method.

The semiconductor structure 80 includes an insulation layer, a layer of floating-gate electrode material and a nitride layer. The materials and the layer thicknesses of the (not shown) layers of the semiconductor structure 80 are already described above.

A plurality of trenches 82 are etched into the surface of the semiconductor structure 80 to form active area lines AA and strings of floating-gate electrodes FG at the interspaces 84 of the trenches 82. The trenches 82 extend into the substrate of the semiconductor structure 80. Each of the trenches 82 has sections 86 and 88 with two different widths w1 and w2, wherein a section 86 is arranged between two adjacent sections 88 of the trench 82. Between two adjacent sections 86 of the same trench 82 a section 88 is arranged.

The width w1 of the sections 86 is larger than the width w2 of the sections 88. The length of the sections 86 may be larger than the length of the sections 88. Thus, a plurality of stilts 90 are formed at each side of the interspaces 84. Of course, the present technology is not restricted to trenches 82 with only two different sections. A trench 82 may include additional sections with widths different from w1 and w2. Furthermore, the trenches 82 may have a non-straight shape.

Each of the active area lines AA has a plurality of form-supporting elements formed of the material of the substrate, wherein the form-supporting elements are subunits of the stilts 90. Moreover, the strings of floating-gate electrodes FG have similar form-supporting elements formed of the layer of floating-gate electrode material.

The active area lines AA and the strings of floating-gate electrodes FG run parallel to each other in a first longitudinal direction L9. The stilts 90 extend from the active area lines AA and the strings of floating-gate electrodes FG in a second longitudinal direction L10, wherein the second longitudinal direction L10 runs perpendicular to the first longitudinal direction L9. The (not show) longitudinal direction of the form-supporting elements of the active area lines AA and the strings of floating-gate electrodes FG is equal to the second longitudinal direction L10.

The form-supporting elements contact the long sidewalls of the active area lines AA and the strings of floating-gate electrodes FG. Thus, the form-supporting elements may increase the stability of the active area lines AA and the strings of floating-gate electrodes FG. For instance, the form-supporting elements may inhibit a bending or a breaking of the active area lines AA or of the strings of floating-gate electrodes FG.

In the paragraphs above, the use of the present technology to produce a NAND memory circuit has been described. However, the present technology is not restricted to this example. For instance, it is possible to produce another integrated circuit, like a processor, a DSP (Digital Signal Processor) or an ASIC (Application Specific Integrated Circuit), according to the inventive method. Also, the benefit of the present technology applies to logical transistors or linear transistors in a wide range of different types of integrated circuits.

Other systems, methods, features and advantages of the invention will be or will become apparent to one with skills in the art upon examination of the figures and the detailed description. It is intended that all such additional systems, methods, features and advantages be included within this description, be within the scope of the invention, and be protected by the accompanying claims.

What is claimed is:

1. An integrated circuit comprising:
    an active area line formed of a material of a semiconductor substrate with a first longitudinal direction parallel to an upper surface of the semiconductor substrate;
    wherein the active area line comprises at least one form-supporting element extending in a second longitudinal direction parallel to the upper surface of the semiconductor substrate; and
    wherein the second longitudinal direction is arranged with regard to the first longitudinal direction in an angle unequal to 0 degree and unequal to 180 degree; and
    wherein at least one second active area line is arranged on the integrated circuit, and wherein the form-supporting element extends through the at least two active area lines.

2. The integrated circuit of claim 1, wherein the shape of the active area line with the at least one form-supporting element is defined by trenches etched into the semiconductor substrate.

3. The integrated circuit of claim 1, wherein the active area line comprises a plurality of straight form-supporting elements that are arranged to each other in a way to form a zigzag-shaped line.

4. The integrated circuit of claim 1, wherein the active area line comprises a plurality of non-straight form-supporting elements that are arranged to each other in a way to form an undulating-shaped line.

5. The integrated circuit of claim 1, wherein the second longitudinal direction is arranged perpendicular with regard to the first longitudinal direction.

6. The integrated circuit of claim 2, wherein at least one of the trenches is a non-straight trench.

7. The integrated circuit of claim 6, wherein at least one of the trenches is a zigzag-shaped trench.

8. The integrated circuit of claim 6, wherein at least one of the trenches is an undulating-shaped trench.

9. The integrated circuit of claim 6, wherein at least one of the trenches has a periodic non-linear pattern.

10. , An integrated circuit comprising:
    an active area line formed of a material of a semiconductor substrate with a first longitudinal direction parallel to an upper surface of the semiconductor substrate;
    wherein the active area line comprises at least one form-supporting element extending in a second longitudinal direction parallel to the upper surface of the semiconductor substrate;
    wherein the second longitudinal direction is arranged with regard to the first longitudinal direction in an angle unequal to 0 degree and unequal to 180 degree;
    wherein the active area line comprises a plurality of non-straight form-supporting elements that are arranged to each other in a way to form an undulating-shaped line; and
    wherein at least one second active area line is arranged on the integrated circuit, and wherein the form-supporting element extends through the at least two active area lines.

11. The integrated circuit of claim 10, wherein the form-supporting element is covered at least partially by a source line.

12. An integrated circuit comprising:
    an active area line formed of a material of a semiconductor substrate with a first longitudinal direction parallel to an upper surface of the semiconductor substrate;
    wherein the active area line comprises at least one form-supporting element extending in a second longitudinal direction parallel to the upper surface of the semiconductor substrate; and
    wherein the second longitudinal direction is arranged with regard to the first longitudinal direction in an angle unequal to 0 degree and unequal to 180 degree; and
    wherein the form-supporting element is covered at least partially by a source line.

* * * * *